(12) United States Patent
Ito et al.

(10) Patent No.: US 11,768,553 B2
(45) Date of Patent: Sep. 26, 2023

(54) INPUT DEVICE FOR VEHICLE

(71) Applicant: DENSO CORPORATION, Kariya (JP)

(72) Inventors: Masahiro Ito, Kariya (JP); Kazuteru Itou, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/988,935

(22) Filed: Nov. 17, 2022

(65) Prior Publication Data

US 2023/0070324 A1 Mar. 9, 2023

Related U.S. Application Data

(63) Continuation of application No. PCT/JP2021/011733, filed on Mar. 22, 2021.

(30) Foreign Application Priority Data

May 19, 2020 (JP) .................................. 2020-087533

(51) Int. Cl.
*G06F 3/041* (2006.01)
*G06F 3/044* (2006.01)

(52) U.S. Cl.
CPC .......... *G06F 3/04144* (2019.05); *G06F 3/044* (2013.01); *G06F 2203/04103* (2013.01); *G06F 2203/04105* (2013.01)

(58) Field of Classification Search
CPC . G06F 2203/04103; G06F 2203/04105; G06F 3/041; G06F 3/04144; G06F 3/044; B60R 16/02
See application file for complete search history.

(56) References Cited

U.S. PATENT DOCUMENTS

| 2010/0253645 A1* | 10/2010 | Bolender | G06F 3/0418 345/174 |
|---|---|---|---|
| 2011/0227866 A1* | 9/2011 | Kawaguchi | G06F 3/041 345/174 |
| 2012/0098767 A1* | 4/2012 | Takai | G06F 3/04142 345/173 |
| 2013/0038551 A1* | 2/2013 | Shirai | G06F 3/044 345/173 |
| 2015/0160751 A1* | 6/2015 | Ishizone | G06F 3/0447 345/173 |

(Continued)

FOREIGN PATENT DOCUMENTS

JP 6474495 B2 2/2019

*Primary Examiner* — Hong Zhou
(74) *Attorney, Agent, or Firm* — Harness, Dickey & Pierce, P.L.C.

(57) ABSTRACT

An input device has an operative member on which switches are arranged to receive a pushing force. The input device has a control unit which is configured to store both a first correction coefficient and a second correction coefficient. The first correction coefficient may correct variations in displacement caused by differences in pushing positions on the operative member. The second correction coefficient may correct differences in sensitivity among a plurality of sensors. The control unit is configured to perform: correcting a plurality of displacements by the first correction coefficient and the second correction coefficient; and determining whether presence or absence of a push operation by comparing a summation of corrected values with a predetermined threshold value.

8 Claims, 15 Drawing Sheets

(56) References Cited

U.S. PATENT DOCUMENTS

| | | | |
|---|---|---|---|
| 2017/0017312 A1* | 1/2017 | Shikata | ............... G06F 3/03547 |
| 2018/0081478 A1* | 3/2018 | Hong | .................... G06F 3/0447 |
| 2018/0239443 A1 | 8/2018 | Wakuda et al. | |
| 2020/0142512 A1* | 5/2020 | Takai | ..................... H01H 13/00 |
| 2022/0365617 A1* | 11/2022 | Araya | ................. G06F 3/03547 |

* cited by examiner

INPUT DEVICE FOR VEHICLE

CROSS REFERENCE TO RELATED APPLICATION

The present application is a continuation application of International Patent Application No. PCT/JP2021/011733 filed on Mar. 22, 2021, which designated the U.S. and is based on and claims the benefit of priority from Japanese Patent Application No. 2020-087533 filed on May 19, 2020, the entire disclosure of the above application is incorporated herein by reference.

TECHNICAL FIELD

The present disclosure relates to an input device for a vehicle which performs to input an input operation of an operator to a device mounted on a vehicle. The input device detects an operator's finger on a panel.

BACKGROUND

Some input device has a surface panel to which an operator touches a target switch region and further pushes the target switch region to activate a function assigned for the target switch. The input device may have a plurality of switches on the same surface panel.

The input device is required to perform a stable detection performance. For example, in the above example, the input panel is required to detect an input operation evenly on all switch regions. In some cases, pushing amounts may deviate for switch regions. Further, if the input device is applied to a device mounted on a vehicle, vibrations of the vehicle may adversely affect the input device to lower an input performance. In the above aspects, or in other aspects not mentioned, there is a need for further improvements in an input device or an input device for a vehicle.

SUMMARY

The disclosure provides an input device for a vehicle. The input device comprises: an operative member which is movable in a pushing direction by an operator's pushing operation; a support member which is disposed on an opposite side of the operative member opposite to a side where a pushing force is applied to, and supports the operative member at both ends of the operative member; an elastic component which elastically supports, on the support member, a region of the operative member where a pushing force is applied to; a plurality of sensors, each of which is provided on the support member and detects a displacement of the operative member based on a change in distance from the operative member caused by the pushing force; a control unit which determines whether presence or absence of a push operation based on the displacement obtained by the plurality of sensors, wherein the control unit is configured to store the following values: (i) a first correction coefficient for correcting variations in displacement caused by differences in pushing positions on the operative member; and (ii) a second correction coefficient for correcting differences in sensitivity among the plurality of sensors, and wherein the control unit is configured to perform: correcting a plurality of displacements detected by the plurality of sensors by the first correction coefficient and the second correction coefficient while the input device is used and the pushing force is applied to; and determining whether presence or absence of a push operation by comparing a summation of corrected values with a predetermined threshold value.

According to this, since the first correction coefficient and the second correction coefficient are stored in advance in the control unit, it is not necessary to perform real-time calculation each while the input device is actually used. Therefore, it is possible to calculate the summation value without being affected by vibrations during actual use of the input device. It is possible to detect a push operation at a stable constant pushing force regardless of positions of the pushing operation on the operative member by using the summation value described above.

BRIEF DESCRIPTION OF DRAWINGS

The disclosure is further described with reference to the accompanying drawings in which.

DETAILED DESCRIPTION

Figure 1:
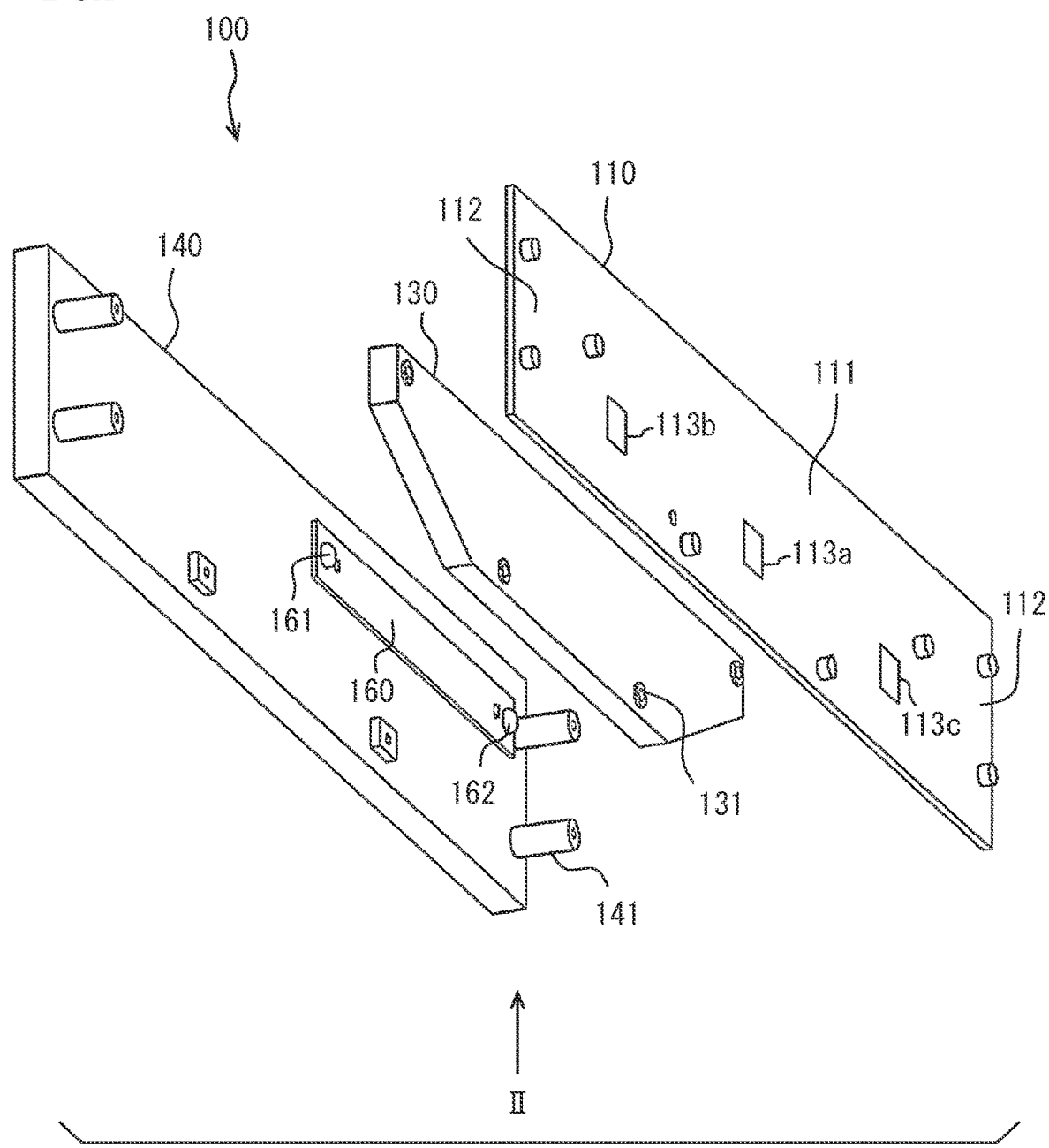
FIG. 1 is an exploded perspective view showing an entire configuration of an input device for a vehicle according to a first embodiment.

Hereinafter, embodiments for implementing the present disclosure will be described referring to drawings. In each embodiment, portions corresponding to the elements described in the preceding embodiments are denoted by the same reference numerals, and redundant explanation thereof may be omitted. When only a part of a configuration is described in an embodiment, the other preceding embodiments can be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

JP6474495B discloses an input device. The input device in JP6474495B includes a proximity sensor or an inclination sensor and a control unit which processes signals from the sensors. The control unit may detect an input operation of an operator based on the signals from the sensors indicative of the inclination.

The input device is required to perform a stable detection performance. For example, if the input device is applied to a device mounted on a vehicle, vibrations of the vehicle may adversely affect the input device to lower an input performance.

It is an object of the present disclosure to provide an input device which is less adversely affected by vehicle vibrations and perform a stable detection performance.

First Embodiment

An input device 100 according to a first embodiment is illustrated in FIGS. 1 to 15. The input device 100 may be referred to as a push panel input device. The input device 100 of the present embodiment is mounted on a vehicle. The input device 100 is applied to a switch unit for inputting instruction of a vehicle air conditioner. The input device 100 is operated, e.g., is pushed, by an operator's finger FGR. The switch unit of the vehicle air conditioner includes, e.g., an air conditioner ON switch, an auto-switch for activating an automatic control, an outlet selection switch, a temperature setting switch, a fan air volume setting switch, and the like. Three switches, e.g., the air conditioner ON switch, the auto switch, and the outlet selection switch, are described as an example. As shown in FIGS. 1 to 5, the input device 100 includes a surface component 110 (SCM), an electrostatic sensor 120 (ESS), an internal mechanical component 130 (IMC), a rear frame 140, an elastic component 150, distance sensors 161 and 162 (DSS), a control unit 170 (COM), and the like.

The surface component 110 is formed as a seamless plate member, for example, by diverting a part of an upright standing surface of the instrument panel of the vehicle. A front surface of the surface component 110 faces an operator. The surface component 110 is made of, for example, an elastic material such as a resin material. The surface component 110 is movable, i.e., elastically deformed in a pushing direction by an operator's pushing operation. The surface component 110 has, e.g., a horizontally long rectangular shape and is fixed to fixing portions 141 formed at four corners of the corresponding rear frame 140. This arrangement may be referred to as a four-point fixed arrangement. Those fixing portions 141 are arranged into two groups including a left group and a right group. The surface component 110 corresponds to an operative member of the present disclosure.

In the left-right direction of the surface component 110, a region inside the fixing portions 141 on both sides is defined as a movable portion 111 which is elastically deformable. In addition, in the left-right direction of the surface component 110, regions outside the fixing portions 141 on both sides are defined as fixed portions 112 which perform no elastic deformation due to fixed support.

In the surface component 110, a switch section is formed within the region of the movable section 111. The switch section is formed as, for example, three switches arranged in a horizontal direction, that is, a center switch 113a, a left end switch 113b, and a right end switch 113c. For example, the center switch 113a is assigned to the automatic switch, the left end switch 113b is assigned to the air conditioner ON switch, and the right end switch 113c is assigned to the outlet selection switch. Each of the switches 113a, 113b and 113c does not have a switch mechanism like a mechanical switch, but merely indicates a position and area of the switch, and is formed as a visible mark on a surface of the surface component 110 by printing or projective machining.

The electrostatic sensor 120 is a position detection unit which detects a pushed position on the surface component 110, e.g., switches 113a, 113b and 113c pushed by an operator. The electrostatic sensor 120 is formed, e.g., by arranging electrodes in a matrix (mesh) shape, and bonding the electrodes to a film member for detecting an electrostatic capacitance. The electrostatic sensor 120 is provided on a back side of the surface component 110, i.e., a side opposite to the operator, opposite to the operator. An overall shape of the electrostatic sensor 120 is set so as to include the positions of the switches 113a, 113b and 113c.

The electrostatic sensor 120 is configured to form a capacitor to generate a capacitance between the electrostatic sensor 120 and an operator's finger FGR placed on the surface component 110, i.e., each of the switches 113a, 113b, and 113c. The electrostatic sensor 120 is configured to output a charge signal CS indicative of a capacitance change caused according to a position of the finger FGR to an electrostatic detection microcomputer 121 (EDM) when the operator pushes, i.e., turns on, one of the switches 113a, 113b and 113c with the finger FGR. Then, the electrostatic detection microcomputer 121 receives the charge signal "CS" and outputs a touch signal "Ts" indicative of a pushed switch to the control section 170. Although the electrostatic detection microcomputer 121 is formed separately from the control unit 170, but may be formed integrally, e.g., may be built into the control unit 170.

The internal mechanical component 130 is arranged on an anti-push side of the surface component 110 opposite to a side where a pushing force is applied to. The internal mechanical component 130 is arranged on an anti-operator side of the electrostatic sensor 120 opposite to a side where an operator exists. The internal mechanical component 130 is a member integrally assembled with the surface component 110. The internal mechanical component 130 is, e.g., a plate-shape and has a trapezoidal shape. The internal mechanical component 130 is fixed to the surface component 110 at fixing portions 131 provided at each corner (four places) so as to sandwich the electrostatic sensor 120. The internal mechanical component 130 is positioned between the electrostatic sensor 120 and the rear frame 140. In addition, the internal mechanical component 130 may be formed integrally with the surface component 110. Further, the outer shape of the internal mechanical component 130 is not limited to a trapezoidal shape, and may be a rectangular shape as shown in FIG. 12, FIG. 13, FIG. 14 or FIG. 15.

The rear frame 140 is arranged on a side opposite to a side of the surface component 110 where the pushing force is applied. In other words, the rear frame 140 is arranged on a side of the internal mechanical component 130 opposite to the operator. The rear frame 140 is a plate member which is arranged as described above, and supports the surface component 110. The rear frame 140 supports the surface component 110 at four fixing portions 141 which are formed on four corners. The four fixing portions 141 are grouped into both ends of the surface component 110. A material of the rear frame 140 is preferably the same material as the surface component 110, e.g., a resin material. The rear frame 140 corresponds to the support member of the present disclosure.

Figure 12:
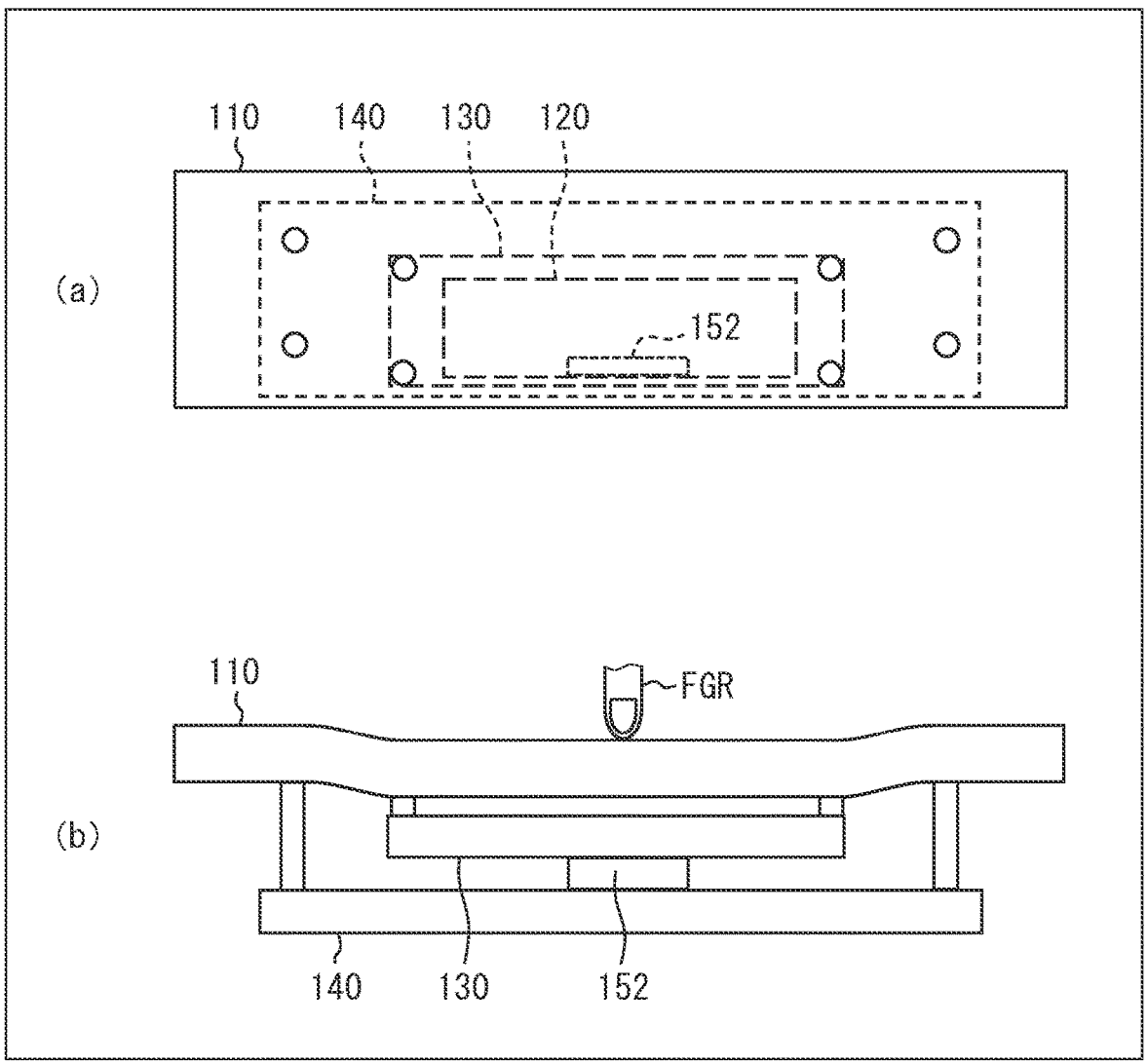
FIG. 12 is a first explanatory diagram showing setting positions of elastic members.
Figure 13:
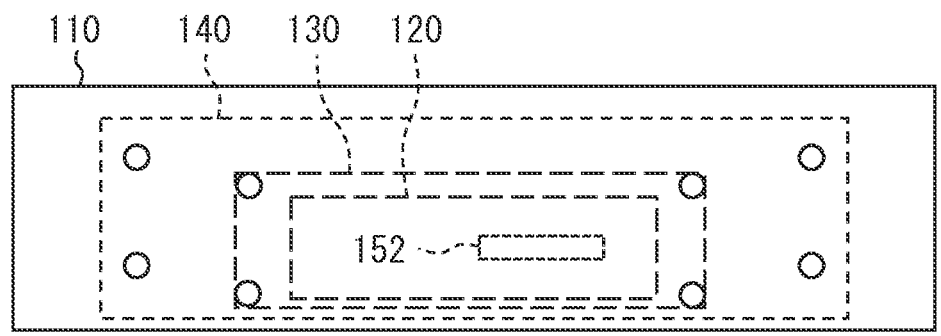
FIG. 13 is a second explanatory diagram showing setting positions of elastic members.
Figure 14:
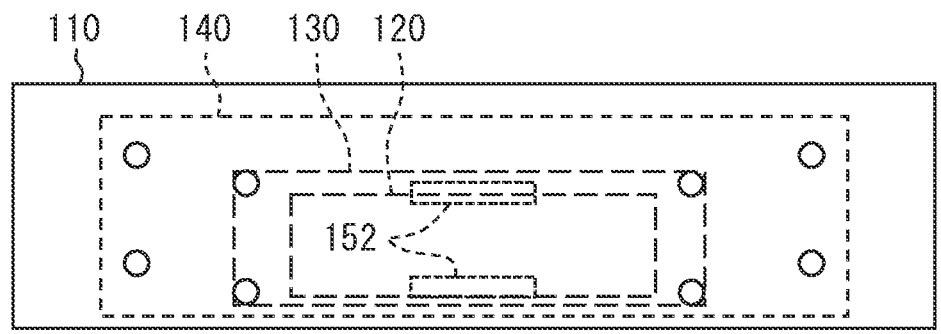
FIG. 14 is a third explanatory diagram showing setting positions of elastic members.
Figure 15:
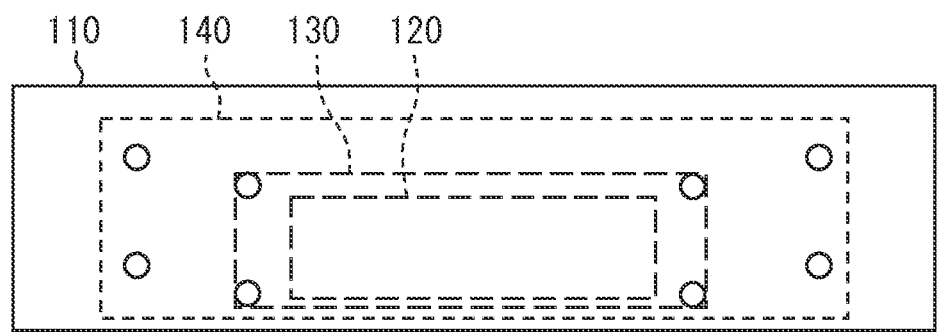
FIG. 15 is a fourth explanatory diagram showing a case where no elastic member is provided.

The elastic component 150 is configured as a member which elastically supports, on the rear frame 140, a region of the surface member 110, i.e., the movable portion 111, where a pushing force "F" is applied to. Here, the elastic component 150 is provided by elastic portions 151 of the surface component 110 and elastic members 152 provided between the internal mechanical component 130 and the rear frame 140. The elastic portion 151 is provided by a part of the surface component 110 located between the fixed portion 112 and the movable portion 111. The elastic members 152 is provided as a separate different member from the internal mechanical component 130 and the rear frame 140. The elastic member 152 may be disposed on various selected positions as shown in FIG. 12, FIG. 13, or FIG. 14. As shown in FIG. 15, the elastic member 152 may not be disposed. In this case the elastic component 150 is provided by the elastic portion 151 alone.

Each one of the distance sensors 161 and 162 is provided on the rear frame 140. Each of the distance sensors 161 and 162 detects a displacement of the surface component 110 based on a change in distance from the surface component 110 caused by the pushing force. Here, since the internal mechanical component 130 is integrally formed on a back side of the surface component 110, each of the distance sensors 161 and 162 detects a change in distance from the internal mechanical component 130. Each of the distance sensors 161 and 162 detects a displacement "DL" of the surface component 110, i.e., the internal mechanical component 130 based on a change in distance from the surface component 110 caused by the pushing force. The distance sensors 161 and 162 are arranged to be spaced apart from each other so as to correspond to a direction in which the switches 113a, 113b and 113c are arranged and are fixed on the substrate 160. Further, the substrate 160 is fixed to a front surface of the rear frame 140. The front surface is a side facing the surface component 110. In this disclosure, it is possible to employ an equivalent configuration in which the substrate 160 is mounted on a back side of the rear frame 140 which is an opposite side to the surface component 110, and detects a change in distance from the surface component 110 by the distance sensors 161, and 162 through a through hole disposed on the rear frame 140. The distance sensors 161 and 162 correspond to the sensors of the present disclosure.

The distance sensors 161 and 162 may be reflection light type distance sensors. The distance sensors 161 and 162 detect a distance signal "Ds" corresponding to a distance between the rear frame 140 and the internal mechanical component 130. The distance signal "Ds" corresponds to the displacement "DL" of the surface component 110. Each one of the distance sensors 161 and 162 detects the distance by using the triangulation method. Each one of the distance sensors 161 and 162 emits light to the surface component 110, i.e., to an inner surface of the internal mechanical component 130 with a predetermined angle. Each one of the distance sensors 161 and 162 receives reflected light from the surface component 110, i.e., from the inner surface of the internal mechanical component 130. Each one of the distance sensors 161 and 162 measures a distance between a light emitting point and a reflected light receiving point as a signal indicative of the distance. Each one of the distance sensors 161 and 162 may output a measured distance as the distance signal "Ds". The distance sensors 161 and 162 are configured to output the detected distance signal "Ds" to the control unit 170. The distance sensors 161 and 162 may include other reflection light type distance sensors using the other phenomenon. The distance sensors 161 and 162 are not limited to reflection light type distance sensors, and may be electrostatic sensors, LCR sensors, magnetic sensors, or the like.

The control unit 170 is configured as a unit which determines whether presence or absence of a push operation to the surface component 110 based on the touch signal "Ts" from the electrostatic detection microcomputer 121 and the distance signals "Ds", i.e., a displacement "DP" from the distance sensors 161 and 162.

The control unit 170 includes a CPU, a RAM, and a storage medium, or the like. A spring correction coefficient "k" and sensor sensitivity correction coefficients "kL" and "kR", which are described later, are stored in advance in the storage medium of the control unit 170. Those values are stored in the storage medium of the control unit 170 at least before an actual use of the vehicle in the market. In other words, those values are stored in the storage medium of the control unit 170 at least before a shipment of the vehicle from a manufacturing factory. Further, the control unit 170 stores in advance a predetermined threshold value for determining presence or absence of a push operation of the operator.

The control unit 170 and the techniques thereof according to the present disclosure may be implemented by one or more special-purposed computers. Such a special-purposed computer may be provided by configuring a processor and a memory programmed to execute one or more functions embodied by a computer program.

Alternatively, the control unit 170 or the method disclosed may be provided by a dedicated computer which includes at least one processor configured by at least one dedicated hardware logic circuits.

Alternatively, the control unit 170 and the like and the method thereof described in the present disclosure may be achieved by one or more dedicated computers constituted by a combination of a processor and a memory programmed to execute one or a plurality of functions and a processor constituted by one or more hardware logic circuits.

The computer program may be stored in a computer-readable non-transition tangible recording medium as an instruction executed by a computer.

Here, the process of the flowchart or the flowchart described in this application includes a plurality of sections (or steps), and each section is expressed as, for example, S100. Further, each section can be divided into multiple subsections, while multiple sections can be combined into one section. Furthermore, each section thus configured may be referred to as a device, module, or means.

The input device 100 is configured as described above, hereinafter operations and advantages are described below with reference to FIGS. 6 to 11.

1. Pre-Shipment Processing (Before Using Vehicle)

Figure 6:
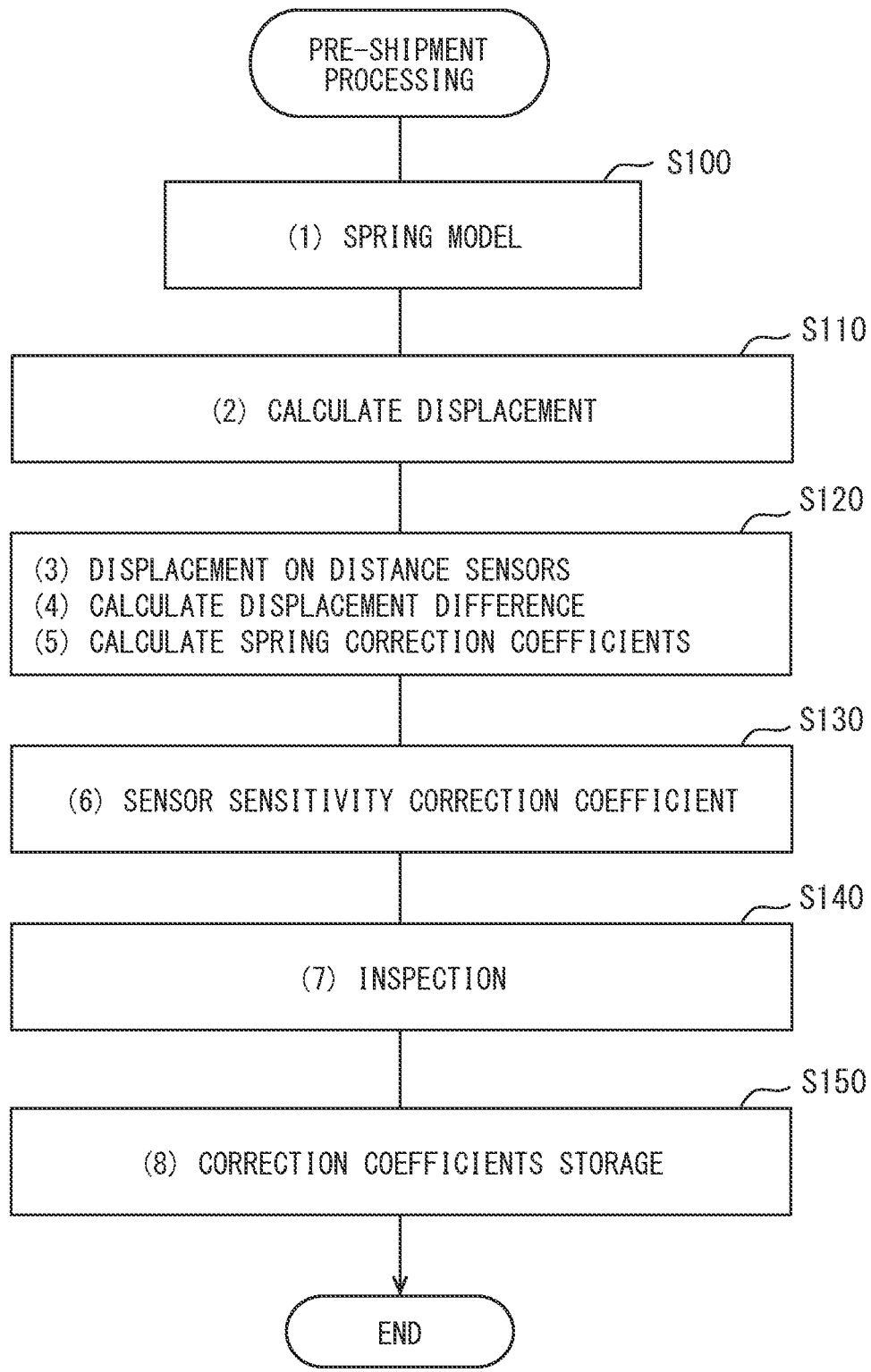
FIG. 6 is a flow chart showing a processing procedure before shipping.

In a pre-shipment stage of the vehicle, a pre-shipment processing is performed based on steps including (1) to (8) shown in FIG. 6. The pre-shipment processing in FIG. 6 is executed, e.g., for each product of the input device 100, for each vehicle model, for each lot of the products. The pre-shipment processing may be performed by a person who works for manufacturing the product, for checking the product in a manufacturing line. Alternatively, the pre-shipment processing may be performed by a device for inspecting the product such as a computer device.

(1) Spring Model

Figure 2:
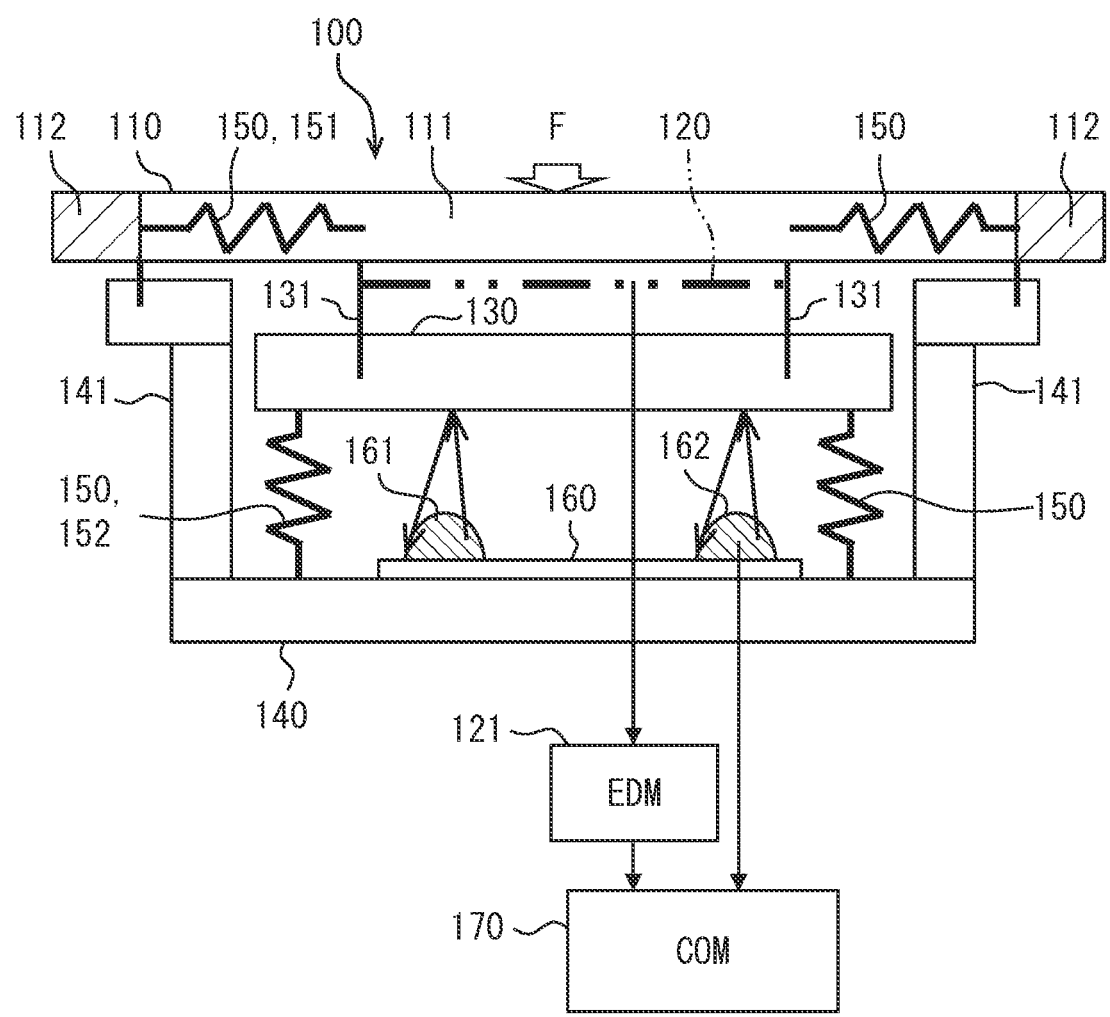
FIG. 2 is a bottom view of the input device viewing in an arrow symbol II in FIG. 1.
Figure 3:
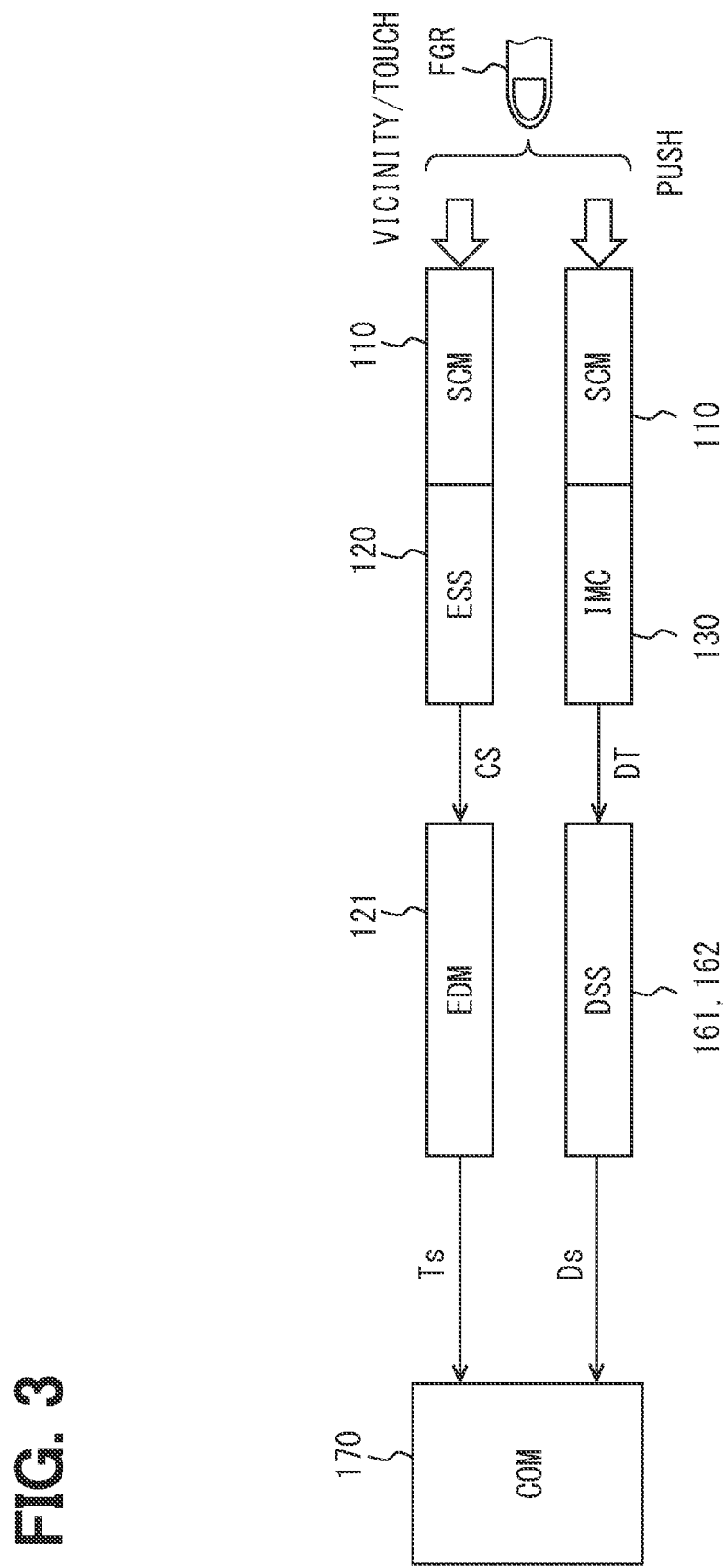
FIG. 3 is an explanatory diagram showing signal flow to a control unit in response to a user's push operation.
Figure 7:
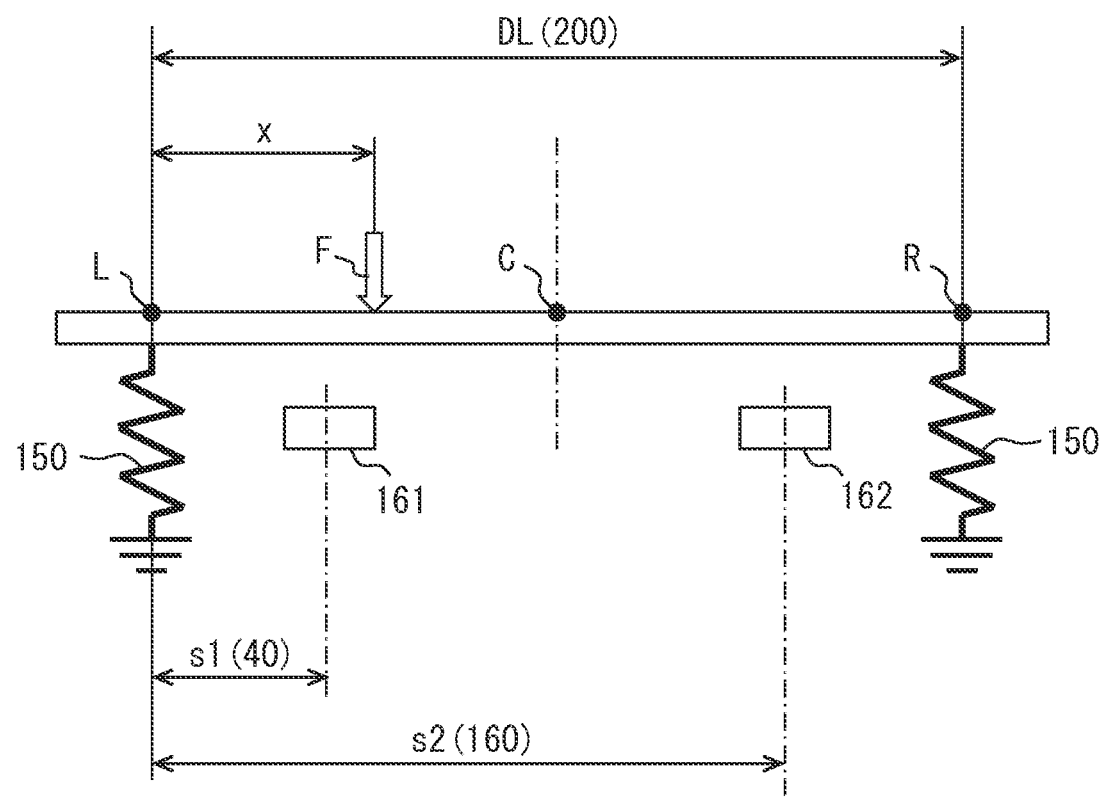
FIG. 7 is a modeled diagram, i.e., an explanatory diagram, showing the input device in a physically modeled fashion.

First, in a step S100 of FIG. 6, a spring model shown in FIG. 7 is set by simplifying a structure of the input device 100 shown in FIG. 2. The spring model may be called a physical model of the input device 100. In this model, the surface component 110 and the internal mechanical component 130 are assumed as an integrated plate member. In this model, a center position of the left end switch 113b is assumed as a point "L" and is used as a zero point "0" in the horizontal direction. The switches 113a, 113b, and 113c are arranged in this horizontal direction. A center position of the center switch 113a is assumed as a point "C". A center position of the right end switch 113c is assumed as a point "R". The elastic component 150 is a virtual spring. The elastic component 150 is assumed immediately below the point "L". The elastic component 150 is also assumed immediately below the point "R". In addition, a distance between the point "L" and the point "R" is assumed as a distance "DL", a distance from the point "L" to a position where a pushing force "F" is applied is assumed "x", a distance from the point "L" to the distance sensor 161 is assumed as a distance "s1", the distance from the point L to the distance sensor 162 is assumed as "s2". In this model, the variables are set as follows: "DL=200 mm"; "s1=40 mm"; and "s2=160 mm".

Figure 8:
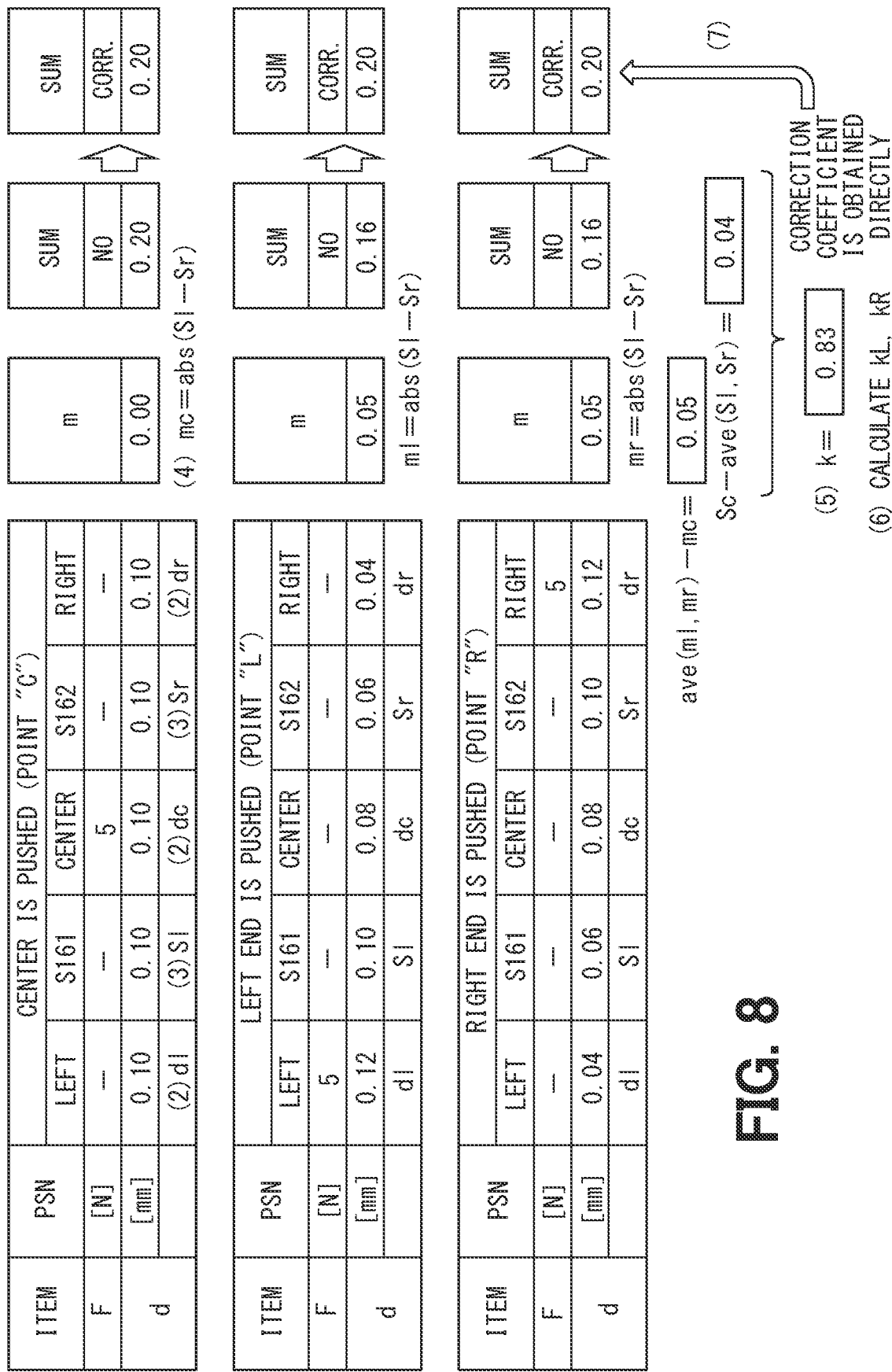
FIG. 8 is a consolidated chart showing calculated samples of items in FIG. 7.

FIG. 8 shows an example of calculation results based on the following procedures (2) to (7). In FIG. 8, "ITEM" shows examples, "F" shows a pushing force, and "d" shows a displacement. "PSN" shows pushing points, "LEFT" shows a left end, "S161" shows a point just above the sensor 161, "CENTER" shows a center point, "S162" shows a point just above the sensor 162, and "RIGHT" shows a right end. "m" shows a displacement difference of the sensors, "SUM" shows a summation of the sensors, "NO" shows "no correction", and "CORR" shows "with correction".

(2) Calculate Displacement

In a step S110, push displacements "dc", "dl", and "dr" with respect to a push operation are obtained. The push displacements are obtained by the FEM calculation or an experimental work by using actual device.

Figure 4:
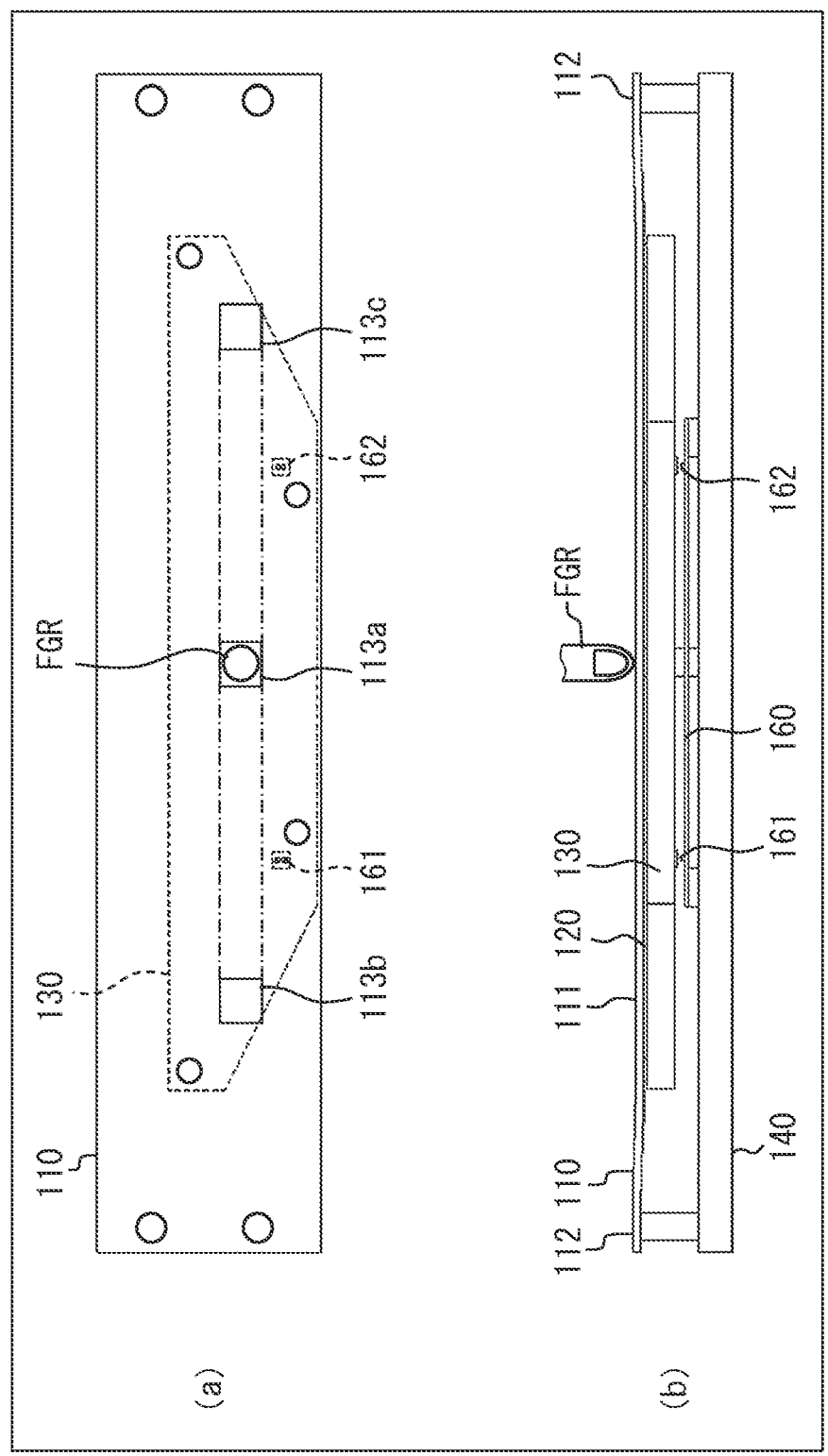
FIG. 4 is an explanatory diagram showing a state in which a center switch is pushed.

In a first stage, the pre-shipment processing applies a pushing force "F" to the center of the surface component 110, and the pre-shipment processing measures the displacement "dc" at the point "C", measures the displacement "dl" at the point "L", and measure the displacement "dr" at the point "R". This first stage is illustrated in FIG. 4.

In a second stage, the pre-shipment processing applies a pushing force "F" to the left end of the surface component 110, and the pre-shipment processing measures the displacement "dc" at the point "C", measures the displacement "dl" at the point "L", and measure the displacement "dr" at the point "R".

Figure 5:
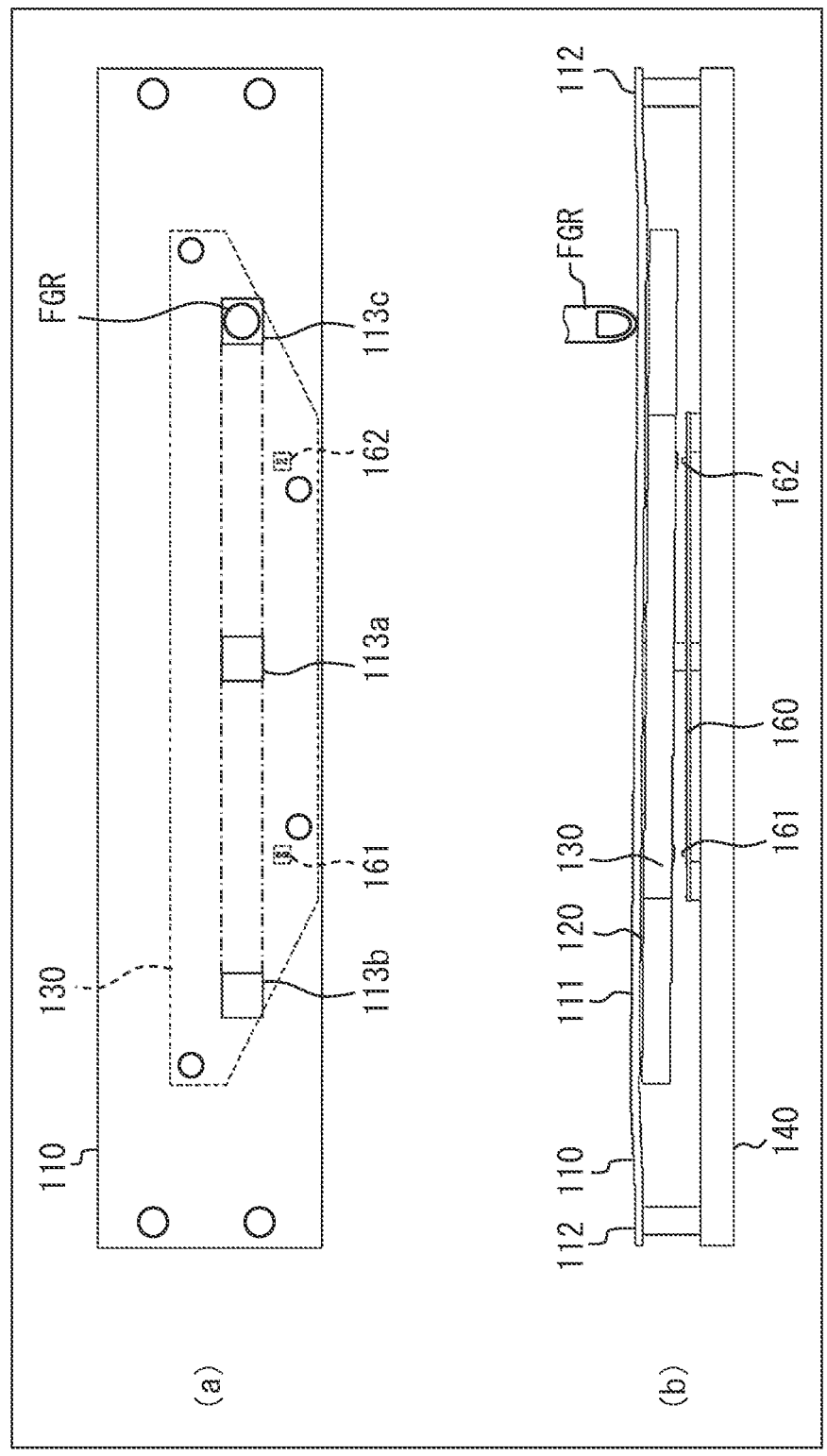
FIG. 5 is an explanatory diagram showing a state in which a right end switch is pushed.

In a third stage, the pre-shipment processing applies a pushing force "F" to the right end of the surface component 110, and the pre-shipment processing measures the displacement "dc" at the point "C", measures the displacement "dl" at the point "L", and measure the displacement "dr" at the point "R". This third stage is illustrated in FIG. 5.

(3) Displacement on Distance Sensors

In a step S120, the pre-shipment processing calculates or converts the displacements "Sl" and "Sr" directly above the distance sensors 161 and 162 based on lever ratio of the spring model and the displacements "dc", "dl" and "dr". At this stage, an average value of the displacements "Sl" and "Sr" is assumed as the displacement "Sc". The displacement "Sc" is nearly equal to the displacement "dc".

(4) Calculate Displacement Difference

In the step S120, displacement differences "mc", "ml", and "mr" immediately above the distance sensors 161 and 162 are calculated for each pushed points.

In a first stage, the pre-shipment processing calculates the displacement difference "mc" by "mc=abs(Sl−Sr)", if the center is pushed. Here, "abs( )" means an absolute value of a difference "Sl−Sr" in the parentheses.

In a second stage, the pre-shipment processing calculates the displacement difference "ml" by "ml=abs(Sl−Sr)", if the left end is pushed.

In a third stage, the pre-shipment processing calculates the displacement difference "mr" by "mr=abs(Sl−Sr)", if the right end is pushed.

(5) Calculate Spring Correction Coefficients

In the step S120, the pre-shipment processing calculates the spring correction coefficient "k" of the elastic component 150 based on the displacement differences "mc", "ml", "mr" and the displacements "Sc", "Sl", "Sr". The spring correction coefficient "k" is calculated by using the following equation: "k=(Sc−ave(Sl, Sr))/(ave(ml, mr)−mc)". Here, "ave( )" means an average value of items listed in the parenthesis. The spring correction coefficient "k" may be referred to as a first correction coefficient.

(6) Sensor Sensitivity Correction Coefficient

In a step S130, the pre-shipment processing calculates sensor sensitivity correction coefficients "kL" and "kR" for the distance sensors 161 and 162, respectively. The sensor sensitivity correction coefficients "kL" and "kR" are calculated for canceling sensor individual differences and sensor distance differences by gain adjustment. The pre-shipment processing performs the calculation to satisfy the following equation: "kL/kR=Output value of the distance sensor 162/Output value of the distance sensor 161". The sensor sensitivity correction coefficients "kL" and "kR" may be referred to as second correction coefficients.

(7) Inspection

In a step S140, the pre-shipment processing performs inspection whether or not the correction coefficients are appropriate. The pre-shipment processing calculates a summation values "SumC", "SumL", and "SumR" and inspects whether the summation values "SumC", "SumL", and "SumR" are almost equal to each other. The pre-shipment processing calculates the summation value "SumC" by the following equation: "SumC=Sl+Sr+k·mc". The pre-shipment processing calculates the summation value "SumL" by the following equation: "SumL=Sl+Sr+k·ml". The pre-shipment processing calculates the summation value "SumR" by the following equation: "SumR=Sl+Sr+k·mr". The pre-shipment processing compares those three variables "SumC", "SumL", and "SumR". In the case that the summation values "SumC", "SumL", and "SumR" are equal to each other, the pre-shipment processing determines that value are within the normal range and the correction is performed correctly.

(8) Correction Coefficients Storage

In a step S150, the pre-shipment processing stores the results of the above steps. The pre-shipment processing stores the spring correction coefficient "k" calculated in the step S120 and the sensor sensitivity correction coefficients "kL" and "kR" calculated in the step S130 in a storage medium of the control unit 170.

2. Post-Shipment Processing (During Vehicle Use)

Next, details of control executed by the control unit 170 when the vehicle is used in the market is described with reference to FIG. 9 and FIG. 10.

The control unit 170, including at least one processor, is electrically connected with both the electrostatic sensor 120 and the displacement sensor (the sensors 161 and 162) to receive the detected signals, respectively. The control unit 170 is configured to perform: (i) pre-shipment processing and (ii) post-shipment processing. The pre-shipment processing calculates both a first correction coefficient and a second correction coefficient, and stores both the first correction coefficient and the second correction coefficient in the control unit 170 before shipment of the input device 100. The first correction coefficient corrects variations in displacement caused by differences in pushing positions on the operative member (the surface component 110). The second correction coefficient corrects differences in sensitivity among the plurality of displacement sensors. The post-shipment processing is performed during an actual use of the input device 100.

The control unit 170 is further configured to perform, as the post-shipment processing: (iii) identifying a touched switch touched by the operator among of the switches (the switches 113a, 113b, and 113c) based on the detected signal from the electrostatic sensor 120; and (iv) determining a push operation performed on the touched switch based on the detected signals from the displacement sensors (the sensors 161 and 162).

The control unit 170 is further configured to perform, as the determining a push operation: (v) correcting the displacements detected by the displacement sensors by the first correction coefficient and the second correction coefficient while the input device is used and the pushing force is applied to; and (vi) determining whether presence or absence of the push operation by comparing a summation of corrected displacements with a predetermined threshold value.

Figure 9:
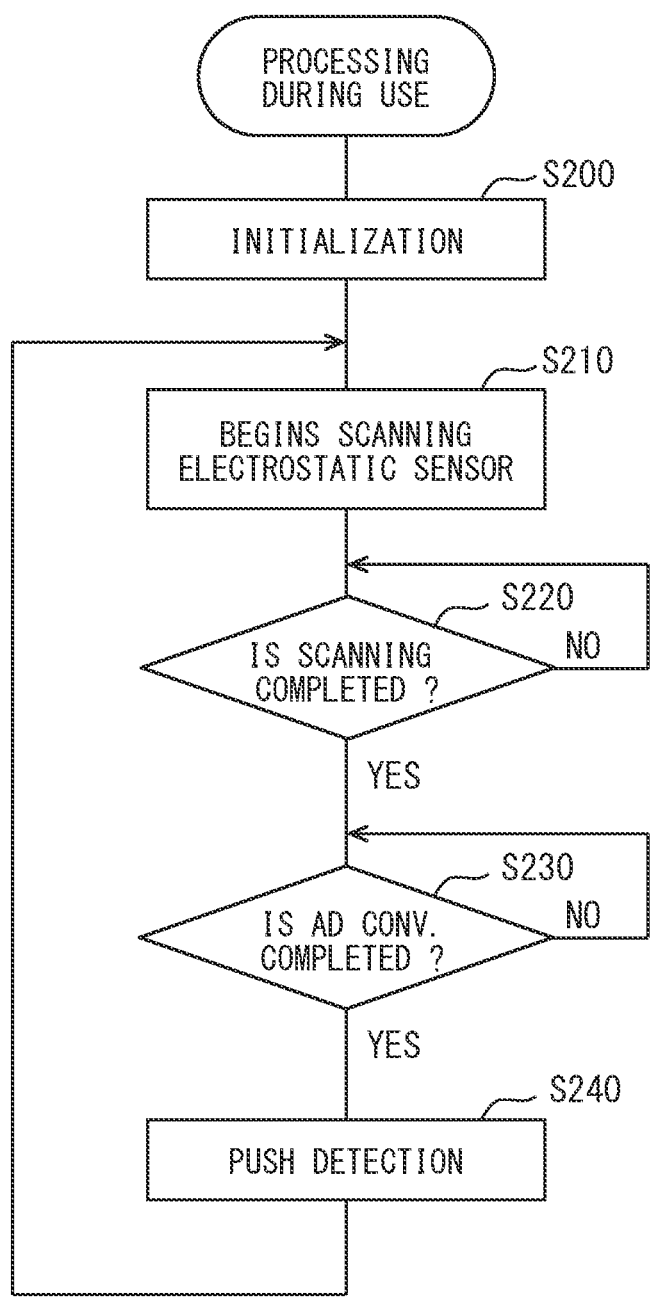
FIG. 9 is a main flowchart showing fundamentals of push detection.
Figure 10:
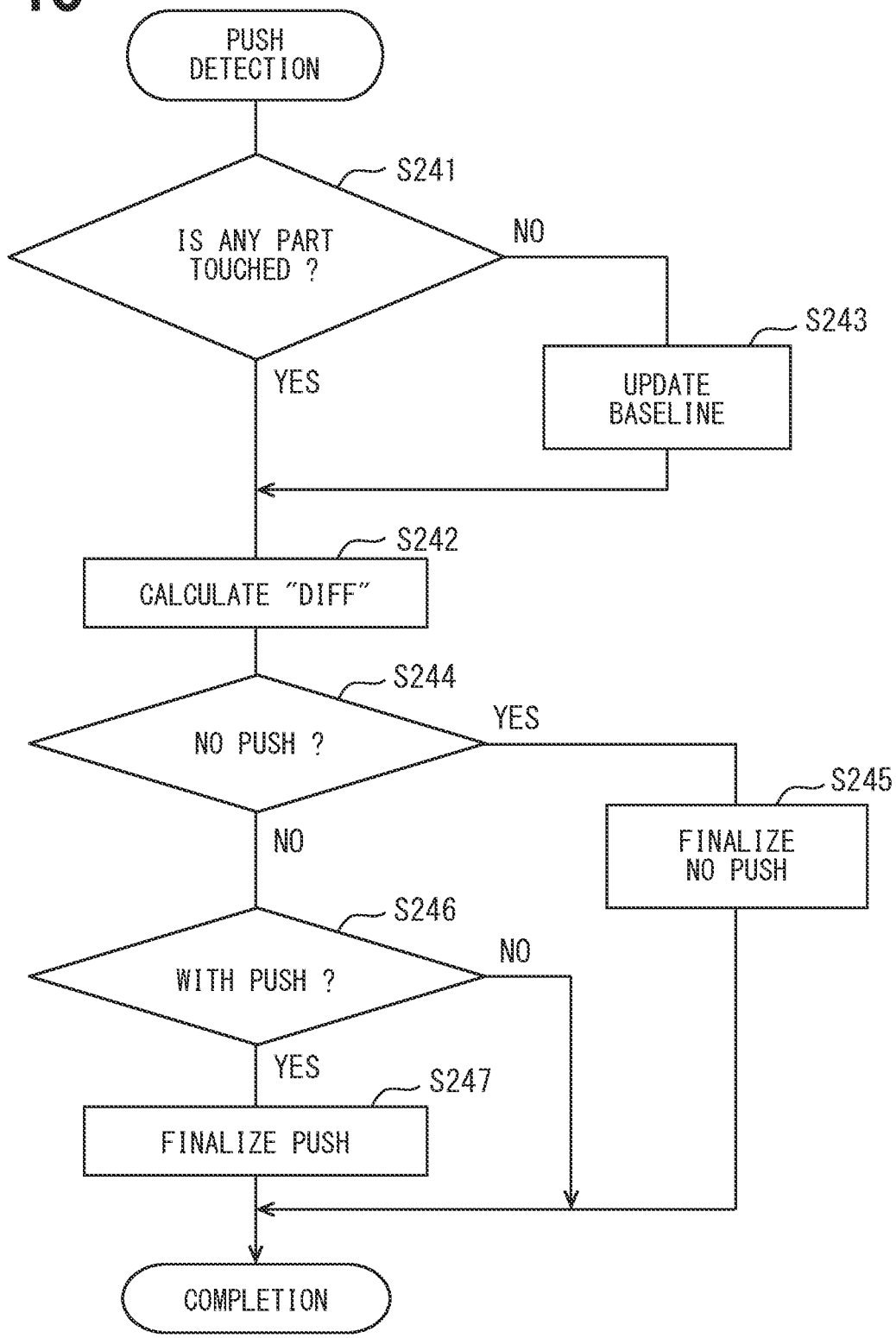
FIG. 10 is a sub-flowchart showing details of push detection in FIG. 9.

First, in a step S200 of FIG. 9, the control unit 170 performs an initialization related to control. In a step S210, the control unit 170 begins a scanning process which scans output data from the electrostatic sensor 120.

Next, in a step S220, the control unit 170 determines whether or not the scanning has been completed. If the control unit 170 determines that the scanning has been completed, the process proceeds to a step S230, and if the control unit 170 determines a negative determination, the step S220 is repeated.

In a step S230, the control unit 170 performs AD conversion, i.e., an analog to digital conversion of the scanned data. In the step S230, the control unit 170 determines whether or not the AD conversion is completed. Here, the AD conversion is a process of reading an analog signal from the electrostatic sensor 120 at fixed time intervals and converting the analog value into a digital signal.

In the case that the control unit 170 determines a completion of the AD conversion by executing the step S230, the control unit 170 proceeds to a step S240. In the step S240, the control unit 170 performs a push detection processing. The push detection is a process of determining whether presence or absence of a push operation to the switch unit. The push detection is performed for each one of the switches 113a, 113b, and 113c. Details are described later, in FIG. 10.

If the step S240 is executed, the control unit 170 returns the flowchart to the step S210, and repeats the steps S210 to S240 while the vehicle is continuously used.

Next, details of the push detection in a step S240 is described with reference to FIG. 10.

First, in the step S241, the control unit 170 determines whether or not at least one part of the switch unit is touched, i.e., whether or not any one of the switches 113a, 113b, and 113c is touched. The control unit 170 performs this step by using the touch signal "Ts" from the electrostatic detection microcomputer 121. If the control unit 170 makes an affirmative determination, the process proceeds to a step S242. If the control unit 170 makes a negative determination, the process proceeds to a step S243.

In the step S242, the control unit 170 calculates a value "Diff" and determines whether presence or absence of a push operation.

In the step S242, "Diff" at the distance sensor 161 is calculated by the following equation: "Diff=dL=SL−BSL", where "BSL" is a baseline value of "SL", "SL" is a raw value of an actually detected data by the distance sensor 161.

In the step S242, "Diff" at the distance sensor 162 is calculated by the following equation: "Diff=dR=SR−BSR", where "BSR" is a baseline value of "SR", "SR" is a raw value of an actually detected data by the distance sensor 162.

Then, as described with reference to FIG. 8, the control unit 170 calculates a displacement difference "m" in the pushing direction between the left end and the right end of the surface component 110 by the following equation: "m=abs(kL·dL−kR·dR)". Here, the sensor sensitivity correction coefficients "kL" and "kR" are stored values stored in advance in the control unit 170.

Further, the control unit 170 corrects the displacements "dL" and "dR" obtained by the distance sensors 161 and 162 by using the sensor sensitivity correction coefficients "kL" and "kR" and the spring correction coefficient "k" stored in the control unit 170 in advance. Then, the control unit 170 calculates the summation value "Sum" of corrected displacements. The control unit 170 calculates the summation "Sum" by the following equation: "Sum=kL·dL−kR·dR+ k·m".

The control unit 170 determines that there is a pushing operation if the summation value "Sum" is equal to or greater than a first predetermined threshold value, i.e., an ON threshold value. The control unit 170 determines that there is no pushing operation if the summation value "Sum" is equal to or less than a second predetermined threshold value, i.e., an OFF threshold value. The second predetermined threshold value is set lower than the first predetermined threshold value by a predetermined small amount.

Further, in a step S243, the control unit 170 performs a baseline update process. The baselines "SL" and "SR" indicate output values of the distance sensors 161 and 162 when no push operation is performed on the switches. The baselines may be referred to as reference lines. Due to characteristics of the distance sensors 161 and 162 and environments such as a temperature, the baselines gradually drift in time series. In other words, the baselines gradually shift and change as the device is used. Therefore, it is possible to update the baselines when no touch operation is performed on the panel. Therefore, the control unit 170 gradually updates the baselines "SL" and "SR". The baselines "SL" and "SR" are not constant during the use of the vehicle.

The control unit 170 performs a step S244 after executing the step S242. In the step S244, the control unit 170 determines whether or not "no push" is established. In this determination, the control unit 170 determines whether or not "Diff" is less than the OFF threshold value. If "no push" is affirmed in the step S244, the control unit 170 proceeds to a step S245. In the step S245, the control unit 170 finalize a determination of "no push".

If "Diff" is greater than the OFF threshold value in the step S244, the control unit 170 determines a negative determination. In this case, the control unit 170 proceeds to a step S246. In the step S246, the control unit 170 determines whether or not "with push" is established. In this determination, the control unit 170 determines whether or not "Diff" is equal to or greater than the ON threshold value. If "with push" is affirmed in the step S246, the control unit 170 proceeds to a step S247. In the step S247, the control unit 170 finalize a determination of "with push". If a negative determination is made in the step S246, the control unit 170 terminates the routine without finalizing the determination.

Figure 11:
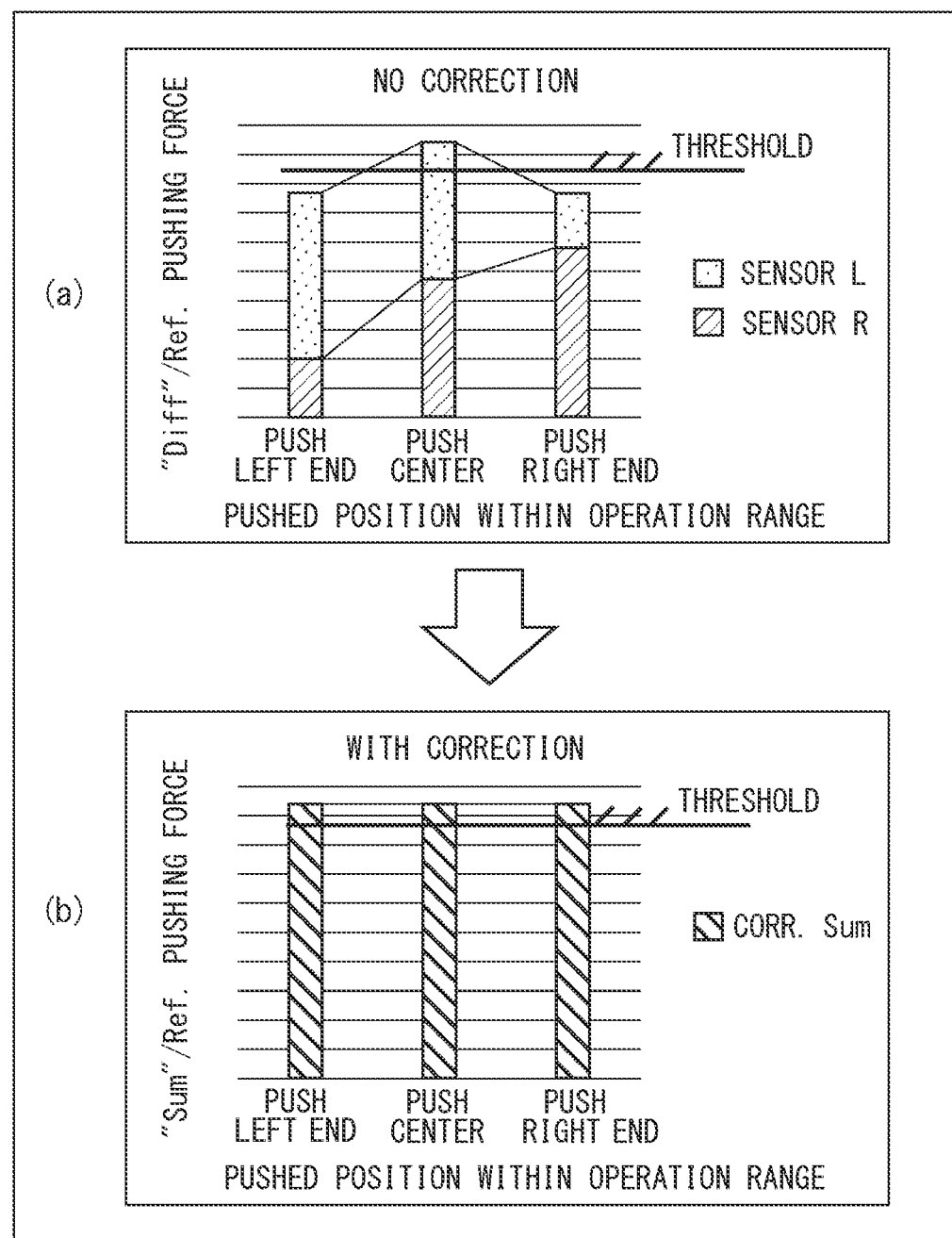
FIG. 11 is a graph showing advantages of the present disclosure.

FIG. 11 illustrates a comparison for "NO CORRECTION" and "WITH CORRECTION". In (a), the vertical axis shows a value "Diff" created by a reference pushing force, the horizontal axis shows positions where a pushing force is applied, a dotted area shows "Diff" amount from the sensor 161 on the left end, and a hatchings area shows "Diff" amount from the sensor 162 on the right end. In (b), the vertical axis shows a value "Sum" created by a reference pushing force, the horizontal axis shows positions where a pushing force is applied, a hatchings area shows "Sum" amount, and "CORR. Sum" means a corrected amount of "Sum".

In the case that the disclosure is not applied, as shown in (a) of FIG. 11, "Diff" values for a reference pushing force deviate depending on pushed positions within an operation range on the surface component 110. In (a) of FIG. 11, even if the same pushing force is applied on the surface component 110, different values "Diff" are observed at pushed positions, therefore, it is impossible to detect a push operation in a stable manner.

In the case that the disclosure is applied, as shown in (b) of FIG. 11, almost the same "Sum" values for a reference pushing force are observed regardless of pushed positions. As described above, if the same pushing force is applied on the surface component 110, almost similar values "Diff" are observed at pushed positions, therefore, it is possible to detect a push operation in a stable manner. It should be noted that the above content is also established at an arbitrary intermediate position between a left or right end and a center.

In this embodiment, the spring correction coefficient "k", and the sensor sensitivity correction coefficients "kL" and "kR", which are used to determine whether presence or absence of a push operation, are stored in advance in the control unit 170. Therefore, the control unit 170 can use the correction coefficients "k", "kL", and "kR" in a real time manner, and is not necessary to calculate those coefficients repeatedly. Therefore, it is possible to calculate the summation value "Sum" without being affected by vibrations during driving the vehicle. It is possible to detect a push operation at a stable constant pushing force regardless of positions of the pushing operation on the surface component 110 by using the summation value "Sum" described above.

In addition, the input device 100 includes the electrostatic sensor 120 which detects a push position on the surface component 110 pushed by an operator. Further, the input device 100 includes the control unit 170 which determines whether presence or absence of a push operation by considering a push position detected by the electrostatic sensor 120. In other words, if both the electrostatic sensor 120 and the distance sensors 161 and 162 are turned on, it is determined that there is a pushing operation, and finalize the determination. This makes it possible to more accurately determine whether one of the switches 113a, 113b, and 113c is pushed.

The surface component 110 is formed from a single member. The surface component 110 is divided into a movable portion 111 and the fixed portion 112. The movable portion 111 corresponds to a region where a pushing force is applied to. The fixed portion 112 corresponds to an outer region where no pushing force is applied to. Accordingly, since the surface component 110 is formed as a seamless member, it is possible to improve design of the surface component 110. It is possible to perform the push detection for a plurality of switches by a less number of the distance sensors. For example, the embodiment performs the push detection for three switches including the center switch 113a, the left end switch 113b, and the right end switch 113c by two distance sensors 161 and 162.

Further, the surface component 110 and the rear frame 140 are made of the same type of material. This makes it possible to provide both components with almost the same uniform the linear expansion coefficients and suppress warping due to differences in the linear expansion coefficients.

Moreover, the surface component 110 is formed from an elastic material. It is possible to use the surface component 110 within an elastic region. The surface component 110 is deformed with extremely small plastic deformation. As a result, the surface component 110 can recover almost all of a deformation amount after removing a pushing force. The surface component 110 used within an elastic region contributes to improve sensitivity stability of the distance sensors 161 and 162.

Second Embodiment

Figure 16:
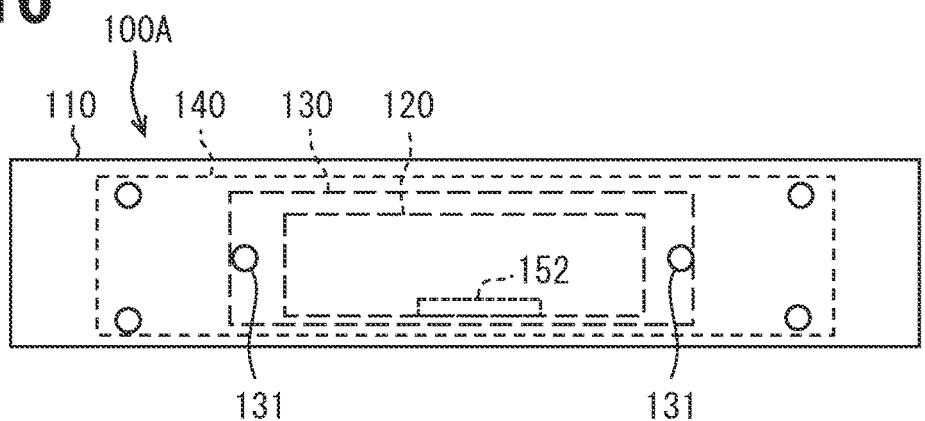
FIG. 16 is an explanatory diagram showing an input device for a vehicle according to a second embodiment.

An input device 100A of the second embodiment is illustrated in FIG. 16. In the first embodiment, the internal mechanical component 130 is fixed to the surface component 110 by the fixing portions 131 at four locations. Alternatively, the number of fixing positions may be varied, e.g., two locations.

Third Embodiment

Figure 17:
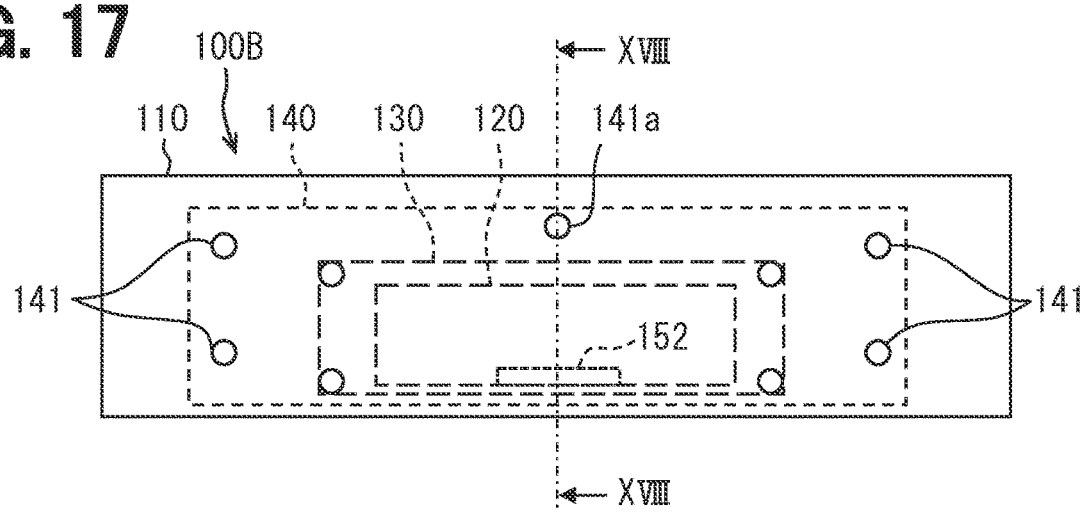
FIG. 17 is an explanatory diagram showing an input device for a vehicle according to a third embodiment.
Figure 18:
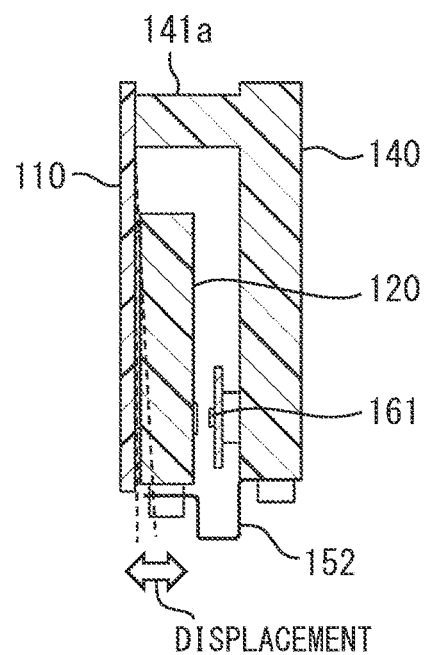
FIG. 18 is a cross-sectional view taken along a line XVIII-XVIII shown in FIG. 17.

An input device 100B according to a third embodiment is illustrated in FIGS. 17 and 18. The third embodiment has a fixing configuration between the surface component 110 and the rear frame 140, which is modified and is different from a fixing configuration of the first embodiment.

The surface component 110 is supported on the rear frame 140 at a plurality of portions including not only both portions close to the left end and the right end of the surface component 110 but also a portion close to the center of the surface component 110. The center of the surface component 110 is provided by the central fixing portion 141a. The fixing portion 141a may be set as a vehicle component and may be configured to support the central portion of the surface component 110.

As a result, it is possible to provide even displacements by reducing a difference in rigidity in the left-right direction of the surface component 110.

Fourth Embodiment

Figure 19:
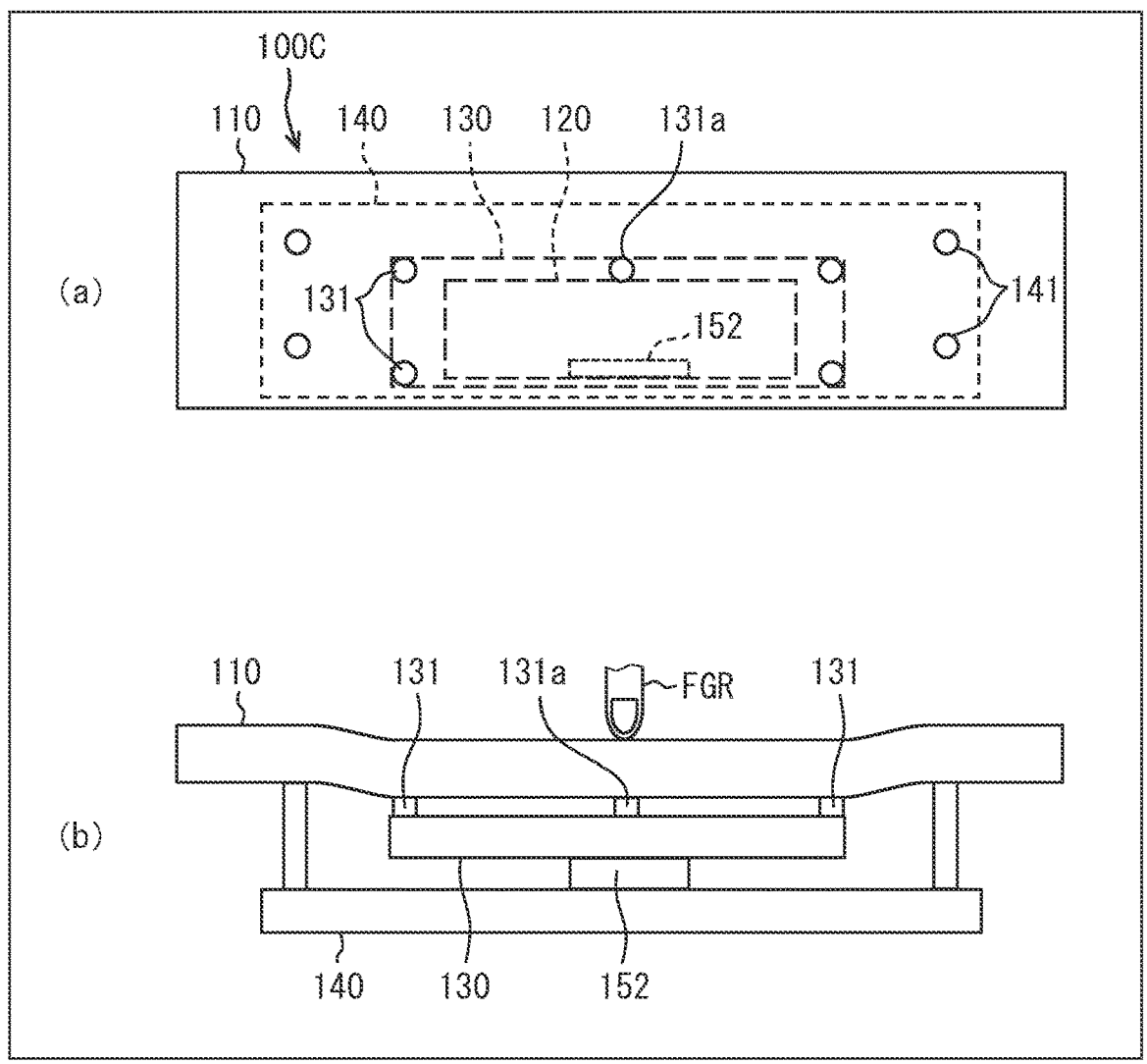
FIG. 19 is an explanatory diagram showing an input device for a vehicle according to a fourth embodiment.

An input device 100C of the fourth embodiment is illustrated in FIG. 19. The fourth embodiment has a fixing configuration between the surface component 110 and the internal mechanical component 130, which is modified and is different from a fixing configuration of the first embodiment.

The internal mechanical component 130 is fixed to the surface component 110 at a plurality of portions including not only both portions close to the ends (the left end and the right end) of the internal mechanical component 130 but also a portion (a center fixing portion 131a) close to the center of the surface component 110.

As a result, it is possible to provide even displacements by reducing a difference in rigidity in the left-right direction of the surface component 110.

Fifth Embodiment

Figure 20:
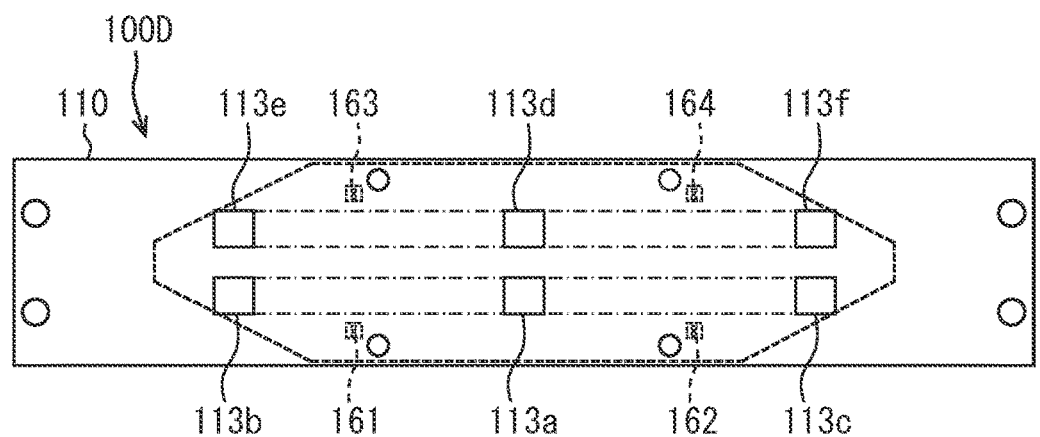
FIG. 20 is an explanatory diagram showing an input device for a vehicle according to a fifth embodiment.

An input device 100D of the fifth embodiment is illustrated in FIG. 20. In the fifth embodiment, a plurality of groups of switches are provided in contrast to the first embodiment.

The input device 100D has two groups of switches. The input device 100D has a first group of switches 113a, 113b, and 113c. The switches 113a, 113b, and 113c are described above. The input device 100D has a second group of switches 113d, 113e, and 113f. The first group and the second group are arranged in a symmetric manner in an up and down direction. The switches 113d, 113e, and 113f correspond to the switches 113a, 113b, and 113c, respectively. The first group of switches 113a, 113b, and 113c, and the second group of switches 113d, 113e, and 113f are arranged in a side by side manner. In this embodiment, a distance sensor 163 and a distance sensor 164 are added to positions corresponding to the second group of switches.

Here, variable are defined as follows: a raw value of the distance sensor 161 is "SL1", a raw value of the distance sensor 162 is "SR1", a raw value of the distance sensor 163 is "SL2", and a raw value of the distance sensor 164 is "SR2".

Further, a value "Diff" of the distance sensor 161 is obtained by the equation "Diff=SL1−BSL1" where "BSL1" is a baseline of "SL1", and "Diff" may be referred to as a displacement "dL1", a value "Diff" of the distance sensor 162 is obtained by the equation "Diff=SR1−BSR1" where "BSR1" is a baseline of "SR1", and "Diff" may be referred to as a displacement "dR1", a value "Diff" of the distance sensor 163 is obtained by the equation "Diff=SL2−BSL2" where "BSL2" is a baseline of "SL2", and "Diff" may be referred to as a displacement "dL2", and a value "Diff" of the distance sensor 164 is obtained by the equation "Diff=SR2−BSR2" where "BSR2" is a baseline of "SR2", and "Diff" may be referred to as a displacement "dR2".

Further, the distance sensor 161 may be corrected by a sensor sensitivity correction coefficient "kL1", the distance sensor 162 may be corrected by a sensor sensitivity correction coefficient "kR1", the distance sensor 163 may be corrected by a sensor sensitivity correction coefficient "kL2", and the distance sensor 164 may be corrected by a sensor sensitivity correction coefficient "kR2". Each sensor sensitivity correction coefficients "kL1", "kR1", "kL2", and "kR2" are stored in the control unit 170 in advance.

A lateral and vertical displacement differences are calculated by the following equations: "mH=abs(kL2·dL2−kR2·dR2)+abs(kL1·dL1−kR1·dR1)"; and "mV=abs(kL2·dL2−kL1·dL1)+abs(kR2·dR2−kR1·dR1)". Here, "mH" is the lateral displacement difference of the pushing direction in the left-right horizontal direction of the surface component 110, and "mV" is the vertical displacement difference of the pushing direction in the up-down vertical direction of the surface component 110.

Then, the summation "Sum" is calculated based on the following equation: "Sum=kL2·dL2+kR2·dR2+kL1·dL1+kR1·dR1+kH·mH+kV·mV".

In the above equation, "kH" is a predetermined weighting value for "mH", and "kV" is a predetermined weighting value for "mV".

Then, similar to the above-described first embodiment, the control unit 170 determines whether presence or absence of a push operation by comparing "Sum" with a predetermined threshold value set in advance.

As described above, in the present embodiment, it is possible to determine whether presence or absence of a push operation with respect to a plurality of groups of switches.

Other Embodiments

The disclosure in this specification and drawings etc. is not limited to the exemplified embodiment. The disclosure encompasses the illustrated embodiments and variations thereof by those skilled in the art. For example, the present disclosure is not limited to the combinations of components and/or elements shown in the embodiments. The present disclosure may be implemented in various combinations. The present disclosure may have additional members which may be added to the embodiments. The present disclosure encompasses the embodiments where some components and/or elements are omitted. The present disclosure encompasses replacement or combination of components and/or elements between one embodiment and another. The disclosed technical scope is not limited to the description of the embodiment. It should be understood that some disclosed technical ranges are indicated by description of claims, and includes every modification within the equivalent meaning and the scope of description of claims.

The above-described embodiments apply the input devices 100, 100A, 1008, 100C, and 100D are applied to a switch panel of a vehicle air conditioner, but those may be applied to, e.g., a switch panel of an audio equipment, or a touch pad of a remote controller, or the like.

What is claimed is:

1. An input device for vehicle, comprising:
an operative member which is movable in a pushing direction by an operator's pushing operation;
a support member which is disposed on an opposite side of the operative member opposite to a side where a pushing force is applied to, and supports the operative member at both ends of the operative member;
an elastic component which elastically supports, on the support member, a region of the operative member where a pushing force is applied to;
a plurality of sensors, each of which is provided on the support member and detects a displacement of the operative member based on a change in distance from the operative member caused by the pushing force; and
a control unit which determines whether presence or absence of a push operation based on the displacement obtained by the plurality of sensors, wherein
the control unit is configured to store the following values:
(i) a first correction coefficient for correcting variations in displacement caused by differences in pushing positions on the operative member; and
(ii) a second correction coefficient for correcting differences in sensitivity among the plurality of sensors, and wherein
the control unit is configured to perform:
correcting a plurality of displacements detected by the plurality of sensors by the first correction coefficient and the second correction coefficient while the input device is used and the pushing force is applied to; and determining whether presence or absence of a push operation by comparing a summation of corrected values with a predetermined threshold value.

2. The input device for vehicle claimed in claim 1, further comprising:

a position detection unit which detects a pushing position where the pushing force is applied to, wherein the control unit determines whether or not the pushing force is applied to, by additionally considering a detected pushing position.

3. The input device for vehicle claimed in claim 1, wherein the operative member is supported on the support member not only on both ends of the operative member but also on a central thereof.

4. The input device for vehicle claimed in claim 1, further comprising:

an internal mechanical component is provided on a side opposite to a side of the operative member where the pushing force is applied to, wherein both ends and a center of the internal mechanical component are fixed to the operative member.

5. The input device for vehicle claimed in claim 1, wherein the operative member is formed of a single member, and is divided into a movable portion which is a region to be pushed and a fixed portion which is an outer region not to be pushed.

6. The input device for vehicle claimed in claim 1, wherein the operative member and the support member are made of the same material.

7. The input device for vehicle claimed in claim 1, wherein the operative member is made of an elastic material.

8. An input device, comprising:

an operative member which has at least three switch regions assigned for different switches, and has elastic components which enable the switch regions to be elastically movable in a push direction responsive to a pushing force applied by an operator;

an electrostatic sensor which outputs detected signal indicative of a touched position on the operative member;

a plurality of displacement sensors which output detected signals indicative of displacements of the operative member responsive to the pushing force, the number of the displacement sensors being less than the number of the switches on the operative member; and a control unit, including at least one processor, which is electrically connected with both the electrostatic sensor and the displacement sensor to receive the detected signal, respectively, and is configured to perform:

(i) pre-shipment processing which calculates both a first correction coefficient for correcting variations in displacement caused by differences in pushing positions on the operative member, and a second correction coefficient for correcting differences in sensitivity among the plurality of displacement sensors, and stores both the first correction coefficient and the second correction coefficient in the control unit before shipment of the input device; and (ii) post-shipment processing which is performed during an actual use of the input device, and wherein the control unit is further configured to perform, as the post-shipment processing:

(iii) identifying a touched switch touched by the operator among of the switches based on the detected signal from the electrostatic sensor; and (iv) determining a push operation performed on the touched switch based on the detected signals from the displacement sensors, wherein the control unit is further configured to perform, as the determining:

(v) correcting the displacements detected by the displacement sensors by the first correction coefficient and the second correction coefficient while the input device is used and the pushing force is applied to; and (vi) determining whether presence or absence of the push operation by comparing a summation of corrected displacements with a predetermined threshold value.

* * * * *